(12) United States Patent
Luo et al.

(10) Patent No.: US 7,897,438 B2
(45) Date of Patent: Mar. 1, 2011

(54) METHOD OF MAKING SEMICONDUCTOR PACKAGE WITH PLATED CONNECTION

(75) Inventors: Leeshawn Luo, Santa Clara, CA (US); Kai Liu, Sunnyvale, CA (US); Ming Sun, Sunnyvale, CA (US); Xiao Tian Zhang, San Jose, CA (US)

(73) Assignee: Alpha and Omega Semiconductor Incorporated, Sunnyvale, CA (US)

(*) Notice: Subject to any disclaimer, the term of this patent is extended or adjusted under 35 U.S.C. 154(b) by 370 days.

(21) Appl. No.: 12/154,537

(22) Filed: May 22, 2008

(65) Prior Publication Data

US 2008/0233679 A1 Sep. 25, 2008

Related U.S. Application Data

(63) Continuation of application No. 11/058,913, filed on Feb. 15, 2005, now Pat. No. 7,394,151.

(51) Int. Cl.
*H01L 21/00* (2006.01)
(52) U.S. Cl. ......... 438/125; 438/127; 438/612; 257/690; 257/693; 257/E21.511
(58) Field of Classification Search .................. 438/108, 438/112, 118, 125, 127, 129, 612, 613, 614; 257/673, 687, 690, 693, 700, 701, 707, 758, 778, E21.498, E21.503, E21.511
See application file for complete search history.

(56) References Cited

U.S. PATENT DOCUMENTS

| | | | |
|---|---|---|---|
| 6,365,432 B1* | 4/2002 | Fukutomi et al. | 438/106 |
| 6,667,557 B2* | 12/2003 | Alcoe et al. | 257/778 |
| 6,774,466 B1* | 8/2004 | Kajiwara et al. | 257/673 |
| 6,927,096 B2* | 8/2005 | Shimanuki | 438/113 |

* cited by examiner

*Primary Examiner* — Khiem D Nguyen
(74) *Attorney, Agent, or Firm* — Van Pelt, Yi & James LLP (57) ABSTRACT

A semiconductor package and method for making a semiconductor package are disclosed. The semiconductor package has a top surface and a mounting surface and includes a die, a conducting connecting material, a plating material and an insulating material. The die has a processed surface facing towards the mounting surface of the semiconductor package. Exposed metal connections are at the processed surface of the die. The conducting connecting material is disposed on the exposed metal connections. The plating material is in contact with the conducting connecting material. The insulating material is formed around the conducting connecting material, and the plating material extends to the exterior of the insulating material.

18 Claims, 10 Drawing Sheets

FIG. 10B

US 7,897,438 B2

METHOD OF MAKING SEMICONDUCTOR PACKAGE WITH PLATED CONNECTION

CROSS REFERENCE TO OTHER APPLICATIONS

This application is a continuation of U.S. patent application Ser. No. 11/058,913, entitled SEMICONDUCTOR PACKAGE WITH PLATED CONNECTION filed Feb. 15, 2005 now issued as U.S. Pat. No. 7,394,151, which is incorporated herein by reference for all purposes.

FIELD OF THE INVENTION

The present invention relates generally to semiconductors. More specifically, a semiconductor package and a method for semiconductor packaging are disclosed.

BACKGROUND OF THE INVENTION

Semiconductor packages protect and secure an integrated circuit (IC), also referred to as a die, contained within the package. A packaged IC device is mounted on a printed circuit board (PCB) to interact with other devices on the PCB and/or with other PCBs. To ensure the proper functioning of the packaged IC device and proper interaction with other devices, semiconductor packages are designed to meet specified temperature, electrical and physical characteristics. For example, packages are designed to meet certain heat dissipation requirements, input/output impedance requirements and dimension requirements.

Flip chip packages are one type of semiconductor package. Instead of using bonding wires, flip chip packages use bonding balls to electrically and mechanically connect the die to exterior connections of the flip chip package. It would be useful to develop advanced techniques for flip chip packaging of certain types of IC devices.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A process for packaging a semiconductor using a plate attached to one surface of a die is disclosed. A lead frame, composed of a removable substrate and a plating material, is constructed. On the processed surface of the die, exposed metal connections are formed during manufacture of the die. A conductive connecting material is attached on top of the exposed metal connections. The lead frame and die are connected such that the conductive connecting material lines up and connects to the plating material of the lead frame. In some embodiments, a connector is attached to the unprocessed side of the die and the plating material using a conducting adhesive. Preferably, the connecter is a tape type interconnect. A molding material is injected around the die, plating material and the connector. The removable substrate is peeled away to expose the plating material. In some embodiments, the peeled parts are cut into separate components.

Figure 1A:
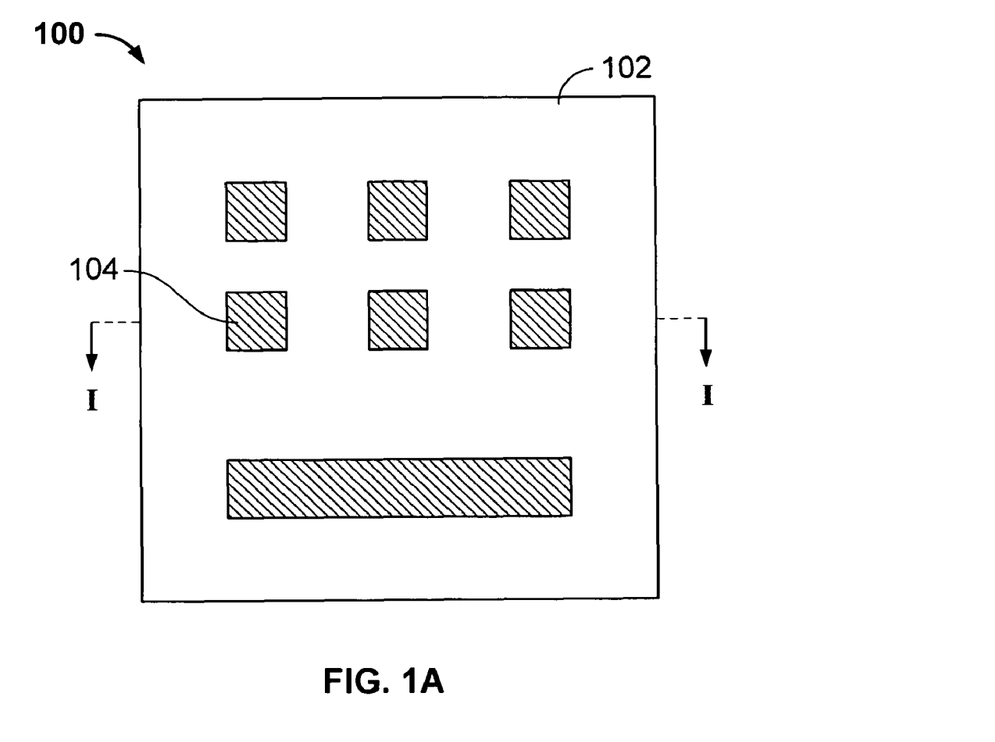
FIG. 1A illustrates a top view of an embodiment of a lead frame.

FIG. 1A illustrates a top view of an embodiment of a lead frame. In this example, lead frame 100 includes a plating material 104 that is deposited on a removable substrate 102. As is described below, plating material 104 forms a connection to the outside of a semiconductor package when the removable substrate is peeled away. Removable substrate 102 is a flat piece of metal or plastic or other material. Seven areas of plating material 104, also referred to as raised leads, are shown plated on removable substrate 102. Gold or other noble metals are used for raised leads 104 and in the embodiment shown raised leads 104 are formed using photolithography. Removable substrate 102 is made of one or a couple of alloys which can be peered away after molding.

Figure 1B:
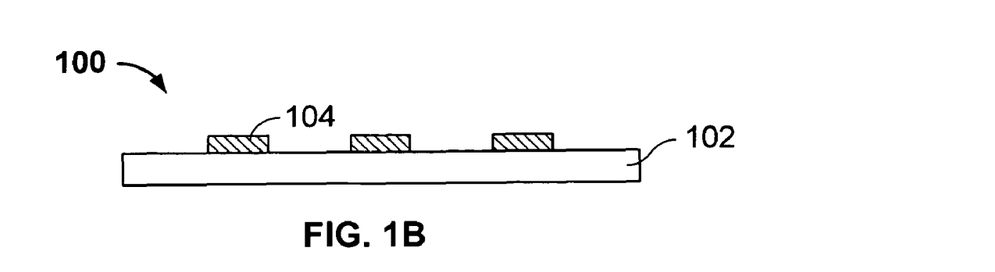
FIG. 1B illustrates a cross sectional view from view I of the lead frame.

FIG. 1B illustrates a cross sectional view from view I of the lead frame. In this example, raised leads 104 are in the same plane. Removable substrate 102 provides a flat base that supports raised leads 104 during the packaging process. While plated on removable substrate 102, raised leads 104 remain in a fixed position with respect to each other. Removable substrate 102 also provides a convenient handle for machines that perform steps in the packaging processes. For example, various machines can grasp removable substrate 102 to rotate, attach other materials to or transport the device. Removable substrate 102 is removed in the packaging process and raised leads 104 are integrated into the package to provide electrical connections for the packaged IC device.

In some embodiments, the forms and dimensions of the raised leads are different from that illustrated. For example, the shapes of the raised leads 104 may have rounded edges instead of straight edges by changing the mask set used during the photolithography process. In some embodiments, the dimensions of raised leads 104 are modified to change the electrical properties of the electrical connections that raised leads 104 provide. For example, in some applications it may be useful to reduce the electrical resistance through raised leads 104. By changing the dimensions (e.g., length, cross sectional area, etc.) the electrical resistance may be reduced.

Figure 2A:
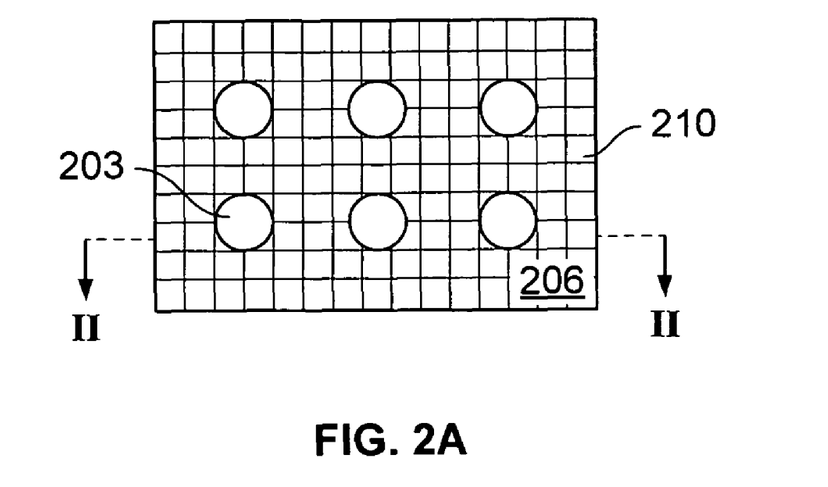
FIG. 2A illustrates a top view of an embodiment of a conducting connecting material attached to the processed surface of a die.

FIG. 2A illustrates a top view of an embodiment of a conducting connecting material attached to the processed surface of a die. In this example, the conducting connecting material is a gold ball. Die 210 has a processed surface 206. Processed surface 206 is the side of die 210 on which semiconductor processes (e.g., photolithography, etching, etc.) have been applied. For example, one or more metal layers may be applied to create routing paths and pads on processed surface 206. Gold balls 203 are attached to processed surface 206 using ultrasonic or other appropriate techniques and provide electrical connections for the packaged IC device.

Figure 2B:
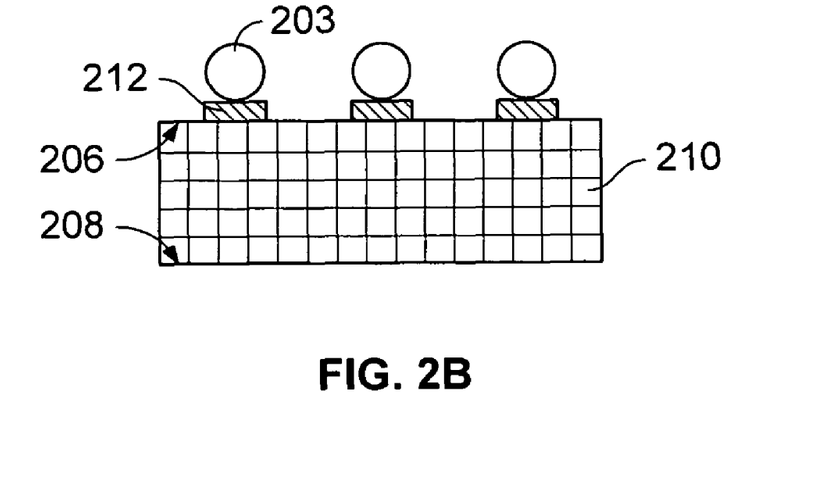
FIG. 2B illustrates a cross sectional view from view II of an embodiment of a conducting connecting material attached to the processed surface of a die.

FIG. 2B illustrates a cross sectional view from view II of an embodiment of a conducting connecting material attached to the processed surface of a die. In this example, there are three gold balls 203, three exposed metal connections 212 and die 210. The three gold balls 203 are attached to exposed metal connections 212, also referred to as input/output (IO) pads. Die 210 has a processed surface 206 and an unprocessed surface 208 opposite. Processed surface 206 includes pads 212. In some embodiments, pads 212 are exposed through contact openings by etching through a passivation layer of dielectric material protecting the processed surface 206. Gold balls 203 are formed on pads 212 and provide electrical connections for the packaging of IC device.

Figure 3A:
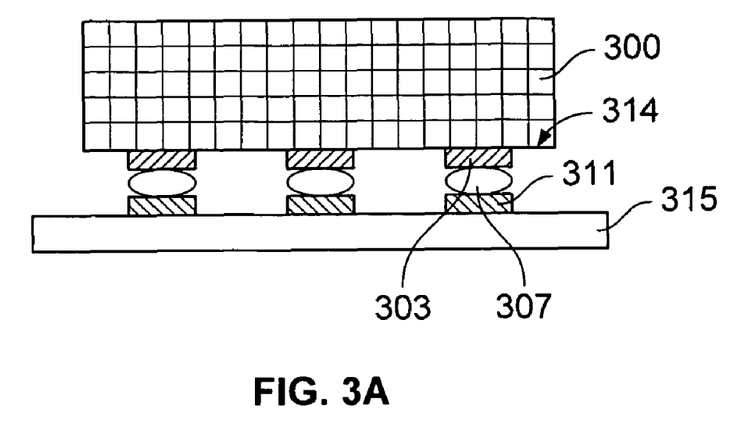
FIG. 3A illustrates a side view of an embodiment of a lead frame attached to a die.

FIG. 3A illustrates a side view of an embodiment of a lead frame attached to a die. In this example, die 300 is oriented such that processed surface 314 is downward facing. Processed surface 314 includes three pads 303. Pads 303 are connected to gold balls 307 which in turn are connected to the raised leads 311. The three raised leads are plated on removable substrate 315. Pads 303, gold balls 307 and raised leads 311 provide electrical connections for the packaged IC device and the removable substrate 315 is peeled away as described below.

Figure 3B:
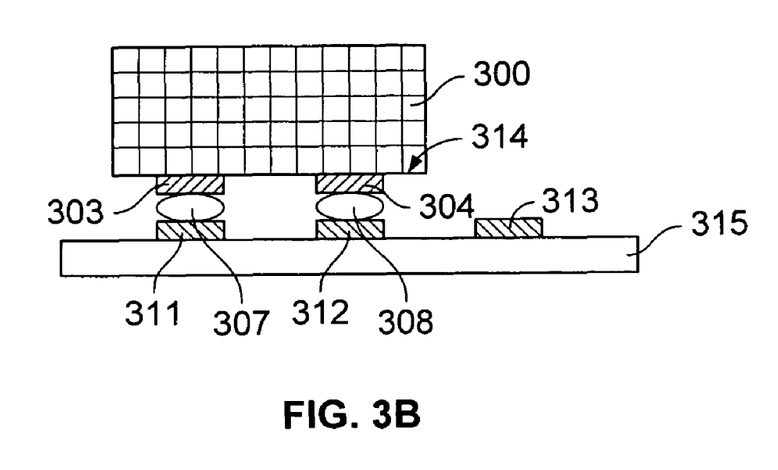
FIG. 3B illustrates a side view of an embodiment of a lead frame attached to a die.

FIG. 3B illustrates a side view of an embodiment of a lead frame attached to a die. In this example, not all of raised leads 311-313 are connected to a gold ball. Raised lead 311 and 312 are connected to gold balls 307 and 308, respectively, but raised lead 313 is not connected to a gold ball. Pad 303 is connected to gold ball 307, which in turn is connected to the raised lead 311 and pad 304 is connected to gold ball 308, which in turn is connected to raised lead 312. Raised leads 311-313 are plated on removable substrate 315.

Plating raised leads 311-313 on removable substrate 315 using photolithography allows for flexible placement of the raised leads. For example, if pads 303-304 are densely packed on processed surface 314, the mask set used during the photolithography process is retooled up to plate raised leads 311-312 closer to each other. Another example is if the placement of pads 303-304 is unusual or asymmetrical. The mask set used in the photolithography process is retooled up so that the placement of the raised leads reflects any unusual or asymmetrical placement of the pads.

Figure 4A:
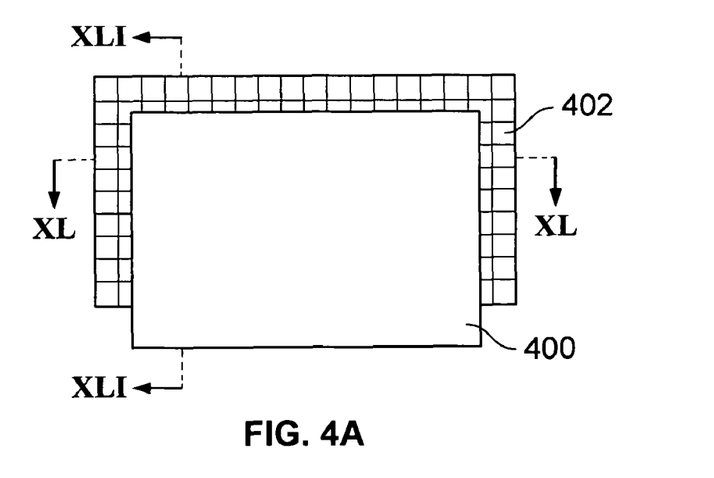
FIG. 4A illustrates a top view of an embodiment of a connector attached to a die.

FIG. 4A illustrates a top view of an embodiment of a connector attached to a die. In this example, the connector is also referred to as a plate. In some embodiments, the connector is a tape type interconnect. Plate 400 has two planes, one of which is illustrated in this figure. In this view, the shape of plate 400 is a rectangle. When connected to die 402, plate 400 does not extend to the edges of die 402 at three of the four edges. On the fourth edge, plate 400 extends beyond the edge.

Figure 4B:
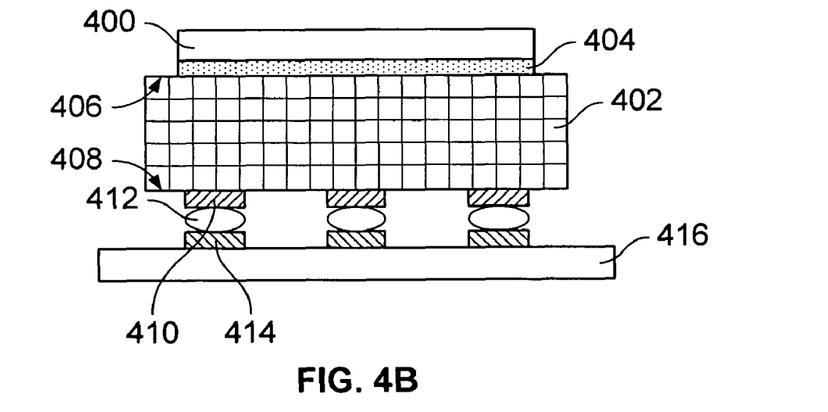
FIG. 4B illustrates a cross sectional view from view XL of an embodiment of a connector attached to a die.

FIG. 4B illustrates a cross sectional view from view XL of an embodiment of a connector attached to a die. In this example, plate 400 is attached to die 402 using adhesive 404. Adhesive 404 may be an epoxy or solder. Using adhesive 404, plate 400 is attached to the unprocessed side of the die 406. On the processed side of the die 408, pad 410 is connected to gold ball 412. Gold ball 412 is connected to the raised lead 414, which in turn is plated on removable substrate 416.

Figure 4C:
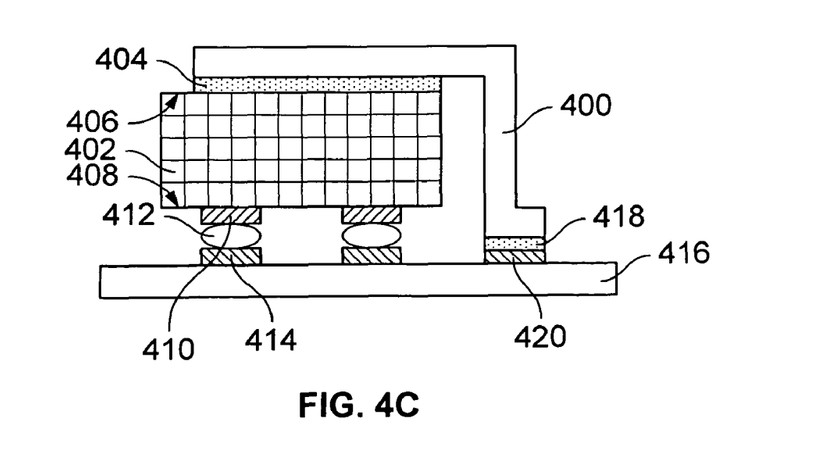
FIG. 4C illustrates a cross sectional view from view XLI of an embodiment of a connector attached to a die.

FIG. 4C illustrates a cross sectional view from view XLI of an embodiment of a connector attached to a die. In this example, plate 400 is shaped such that there are two planes which are parallel to each other. One plane of plate 400 is connected to unprocessed surface 406 using adhesive 404. The other plane of plate 400 is connected to the raised lead 420 using adhesive 418. Adhesive 418 may be an epoxy or solder. From this view, a raised lead is connected to either a gold ball or plate. Raised lead 414 is connected to gold ball 412 which in turn is connected to pad 410. Pad 410 is on the processed side of the die 408. Raised lead 420 is attached to plate 400.

In this example plate 400 is made of copper. In some embodiments another metal is selected for its electrical properties. The metal may be selected for its thermal properties.

Connecting plate 400 to die 402 creates an electrical connection from one side of the die to the opposite side of the die. This is useful when packaging a die which contains vertical elements. That is, elements have a higher or lower placement with respect to each other in the die when the processed surface (or conversely, the unprocessed surface) is downward facing. In this example, one element (a drain) is located at or near unprocessed surface 406 and other elements (the gate and source) are located at or near processed surface 408. Raised lead 414 is therefore electrically connected to a gate or source and raised lead 420 is electrically connected to a drain. In some embodiments the vertical elements or orientation are different.

Figure 5:
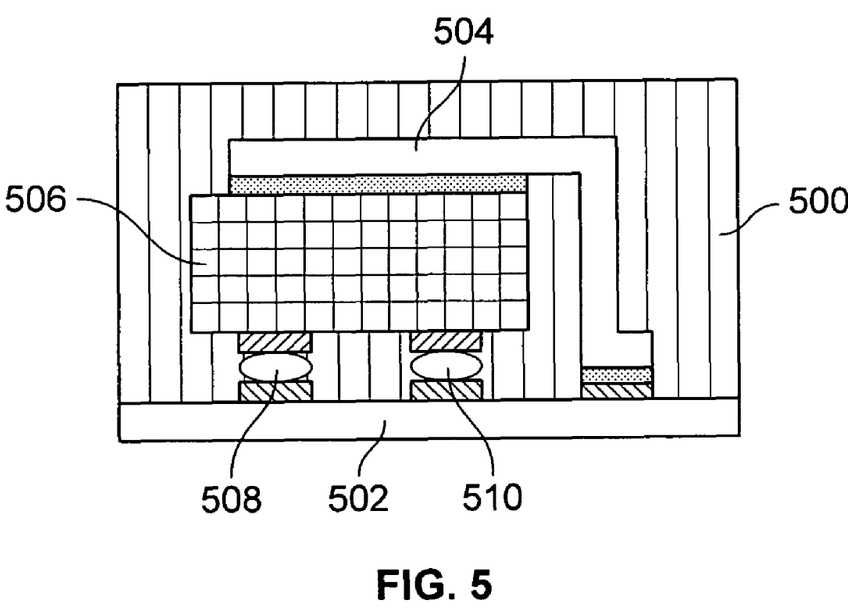
FIG. 5 illustrates a cross sectional view of an embodiment where insulating material is formed around a plating material, conducting connecting material and die.

FIG. 5 illustrates a cross sectional view of an embodiment where insulating material is formed around a plating material, conducting connecting material and die. In this example, insulating material 500 is applied such that only insulating material 500 and removable substrate 502 are exposed at the exterior. Insulating material 500 is plastic and is also referred to as molding. Molding 500 completely envelopes plate 504 and die 506 and is applied between gold ball 508 and gold ball 510, as well as between gold ball 510 and plate 504. In some embodiments, part of plate 504 is exposed to the air for better thermal conduction.

With molding 500 completely enveloping plate 504, die 506 and gold balls 508 and 510, removable substrate 502 is removed. Removable substrate 502 is used during the packaging process but is not part of the packaged IC device. In this example, the removable substrate is peeled away to remove it.

Figure 6A:
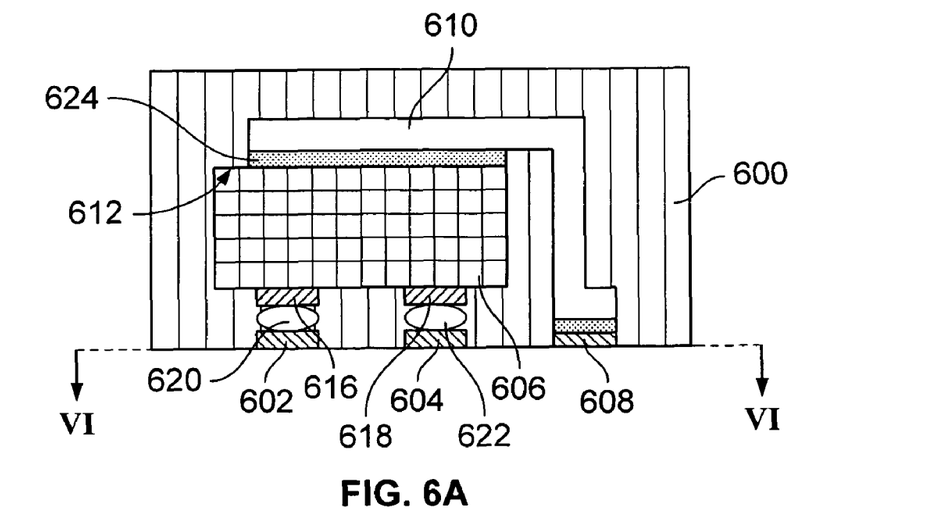
FIG. 6A illustrates a cross sectional view of an embodiment with the removable substrate removed.

FIG. 6A illustrates a cross sectional view of an embodiment with the removable substrate removed. In this example, only molding 600 and raised leads 602, 604 and 608 are extend to the exterior of the package. Plate 610 and die 606 are completely enveloped by molding 600, as are gold balls 620 and 622 and pads 616 and 618. In this example, the raised leads are connected to a gate, source and drain of a MOSFET die. Raised lead 602 is connected to a gate since in this example pad 616 is located at a gate. A source is located at pad 618, so raised lead 604 is connected to a source. Plate 610 provides an electrical connection from the drain (located at unprocessed surface 612) to raised lead 608. Raised leads 602, 604 and 608 provide exposed electrical connections for the PCB to attach to.

Figure 6B:
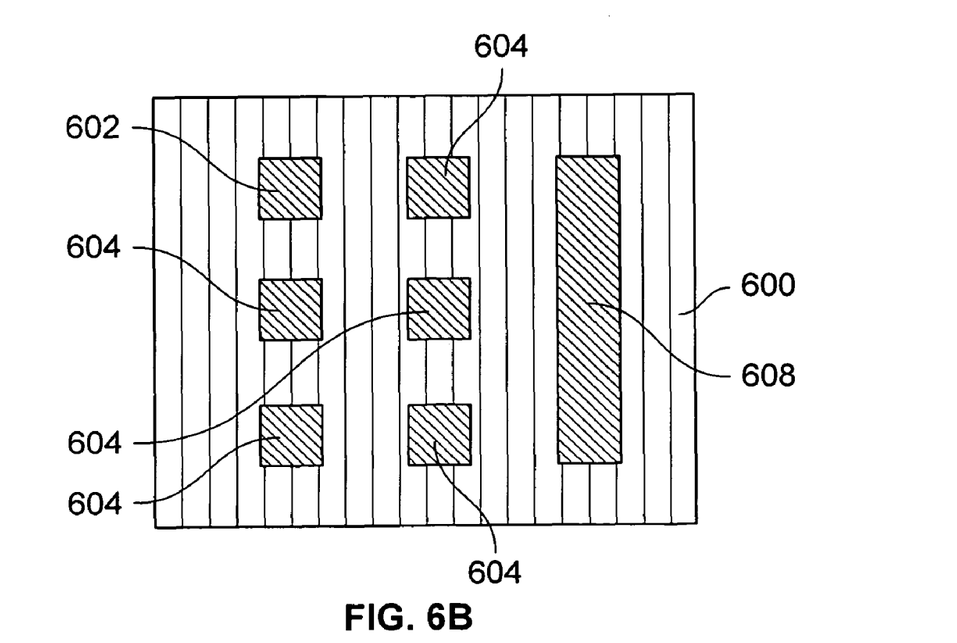
FIG. 6B illustrates a bottom view from view VI of an embodiment with the removable substrate removed.

FIG. 6B illustrates a bottom view from view VI of an embodiment with the removable substrate removed. In this example, there are three types of raised leads exposed to the exterior of the device. Raised lead 602 is electrically connected to a pad which in turn is connected to a gate. Raised leads 604 are electrically connected to pads which in turn are connected to a source. Raised lead 608 is electrically connected to a plate which in turn is connected to a drain.

In some embodiments, the processes described are performed on multiple parts simultaneously. For example, multiple dies may be mounted on the lead frames supported by a large removable substrate. After molding, the entire piece is die sawed into individual devices and the substrate is removed from each device. Alternatively, the substrate may be removed before die sawing. In another embodiment, multiple dies are processed on the same silicon wafer and the whole wafer is mounted on the removable substrate. The layout of lead frames on the removable substrate matches the layout of dies on the wafer. The wafer-substrate combo is diced into narrow bars or individual devices to attach the top plate. The substrate is removed after molding. In some embodiments, the cutting process is performed at a different step.

In some embodiments, there are variations to the semiconductor packaging process described above. For example, one variation is to connect a component to multiple components. Another variation is to remove components from the semiconductor packaging process described above. In some embodiments, geometries of components are different from that described above.

Figure 7A:
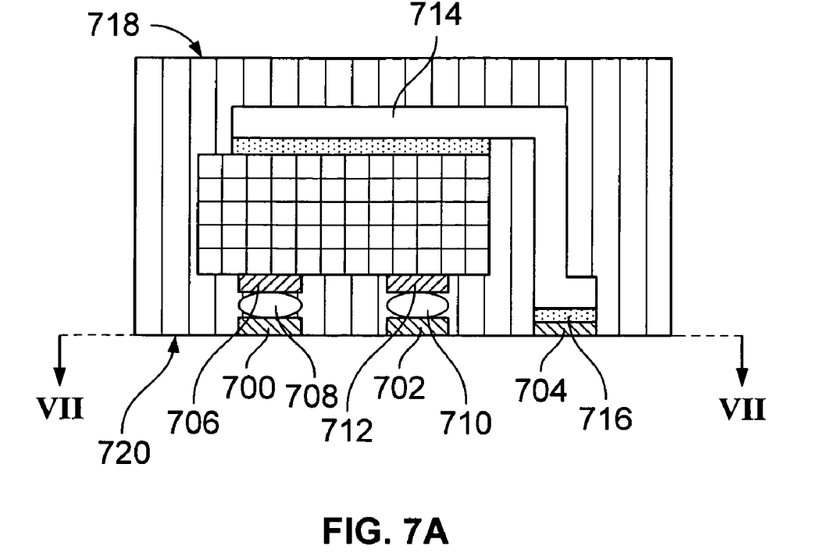
FIG. 7A illustrates a cross sectional view where one raised lead replaces multiple raised leads for the source.

FIG. 7A illustrates a cross sectional view where one raised lead replaces multiple raised leads for the source. In this example, raised lead 702 is connected to gold ball 710 and other gold balls not shown. Gold ball 710 is connected to pad 712. Raised lead 700 is electrically connected to a gate through gold ball 708 and pad 706. Using adhesive 716, raised lead 704 is electrically connected to a drain through plate 714. Raised lead 702 is electrically connected to pad 712 and therefore to a source. Mounting surface 720 is the surface of the packaged IC device which is in contact with a PCB when the packaged IC device is mounted. Opposite mounting surface 720 is the top surface 718.

Figure 7B:
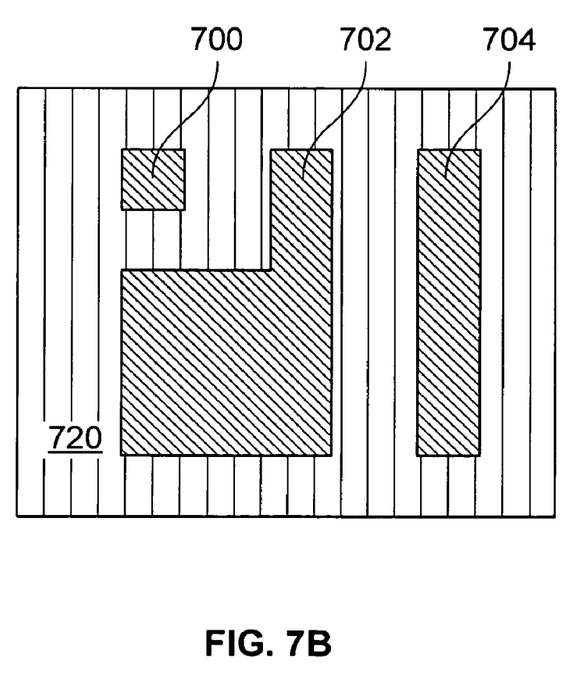
FIG. 7B illustrates a bottom view from view VII of an embodiment where one raised lead replaces multiple raised leads for the source.

FIG. 7B illustrates a bottom view from view VII of an embodiment where one raised lead replaces multiple raised leads for the source. In this example, there are three raised leads and raised lead 702 is connected to multiple gold balls (not shown). Raised lead 700 is electrically connected to the gate, raised lead 702 is electrically connected to the source through multiple gold balls and raised lead 704 is electrically connected to the drain. In this example, an electrical connection which did not exist with the unpackaged die is created using raised lead 702. Mounting surface 720, at which raised leads 700, 702 and 704 are exposed, is in contact with the PCB when the package is mounted. This provides a larger heat dissipation area to the PCB.

Figure 8A:
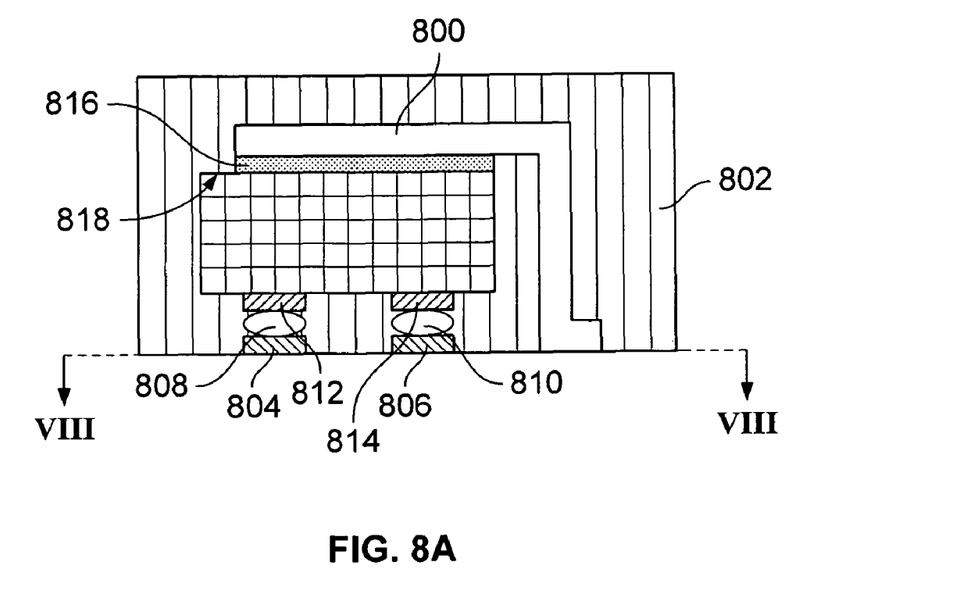
FIG. 8A illustrates a cross sectional view of an embodiment where the plate extends to the exterior of the molding.

FIG. 8A illustrates a cross sectional view of an embodiment where the plate extends to the exterior of the molding. In this example, plate 800 is exposed and extends from the interior of molding 802 to the exterior, as do raised leads 804 and 806. Raised lead 804 is electrically connected to a gate through gold ball 808 and pad 812. Raised lead 806 is electrically connected to a source through gold ball 810 and pad 814. Adhesive 816 connects plate 800 to unprocessed surface 818 and provides an electrical connection from plate 800 to a drain. From the exterior, only molding 802, plate 800 and raised leads 804 and 806 are exposed.

Figure 8B:
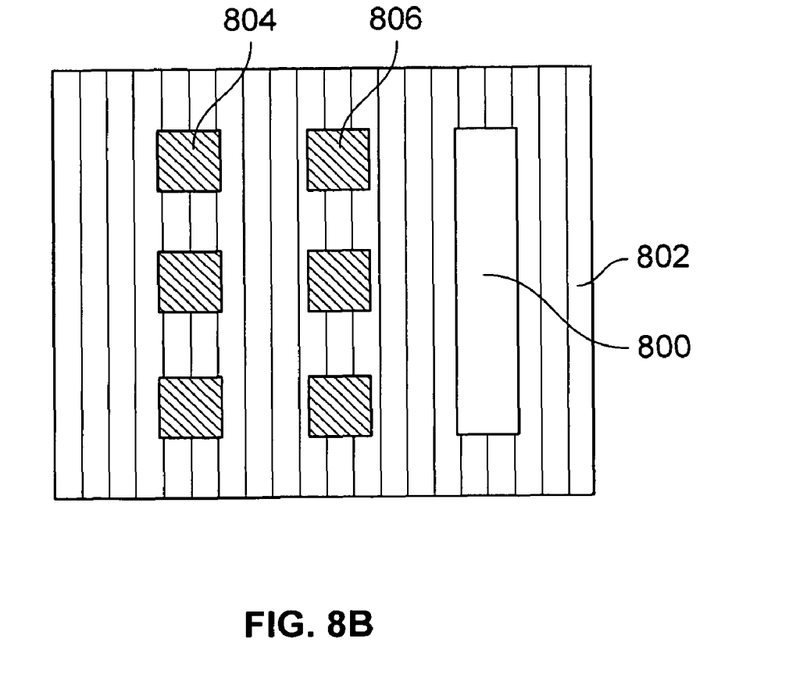
FIG. 8B illustrates a bottom view from view VIII of an embodiment where the plate extends to the exterior of the molding.

FIG. 8B illustrates a bottom view from view VIII of an embodiment where the plate extends to the exterior of the molding. In this example, plate 800 is exposed and extends to the exterior of molding 802. Plate 800 is electrically connected to a drain, raised lead 804 to a gate and raised lead 806 to a source. The plate 800 and raised leads 804 and 806 are surrounded, but not completely, by molding 802. When mounted on a PCB, raised leads 804 and 806 and plate 800 are in contact with the PCB.

Figure 9A:
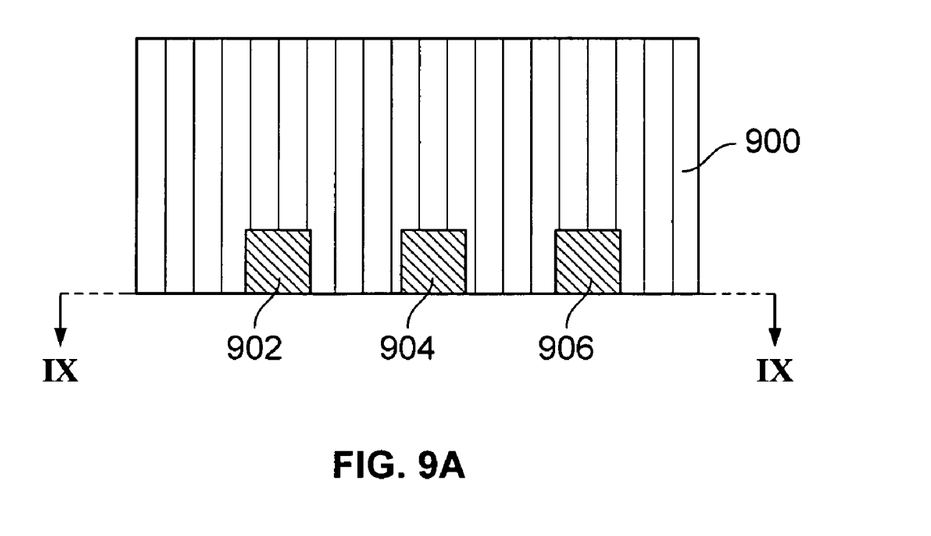
FIG. 9A illustrates a side view of an embodiment where the raised leads extend to more than one exterior surface of the molding.

FIG. 9A illustrates a side view of an embodiment where the raised leads extend to more than one exterior surface of the molding. In this example, raised leads 902, 904 and 906 extend to the exterior of molding 900 at more than one surface. One of the surfaces at which this occurs, the side surface, is illustrated in this figure. Raised lead 902 is electrically connected to a gate, raised lead 904 is electrically connected to a source and raised lead 906 is electrically connected to a drain.

Figure 9B:
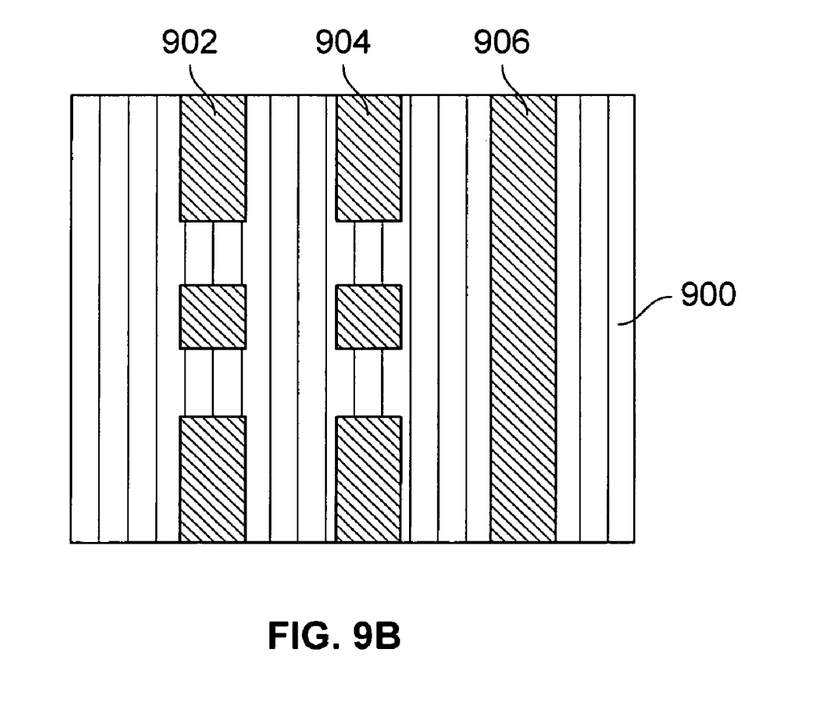
FIG. 9B illustrates a bottom view from view IX of an embodiment where the raised leads extend to more than one exterior surface of the molding.

FIG. 9B illustrates a bottom view from view IX of an embodiment where the raised leads extend to more than one exterior surface of the molding. In this example, raised leads 902, 904 and 906 extend to the exterior of molding 900 at more than one surface. One of the surfaces at which this occurs, the bottom surface, is illustrated in this figure. Raised lead 902 is electrically connected to a gate, raised lead 904 is electrically connected to a source and raised lead 906 is electrically connected to a drain. When mounted on a PCB, raised leads 902, 904 and 906 are in contact with the PCB. The side exposure provides better contact to the PCB.

Figure 10A:
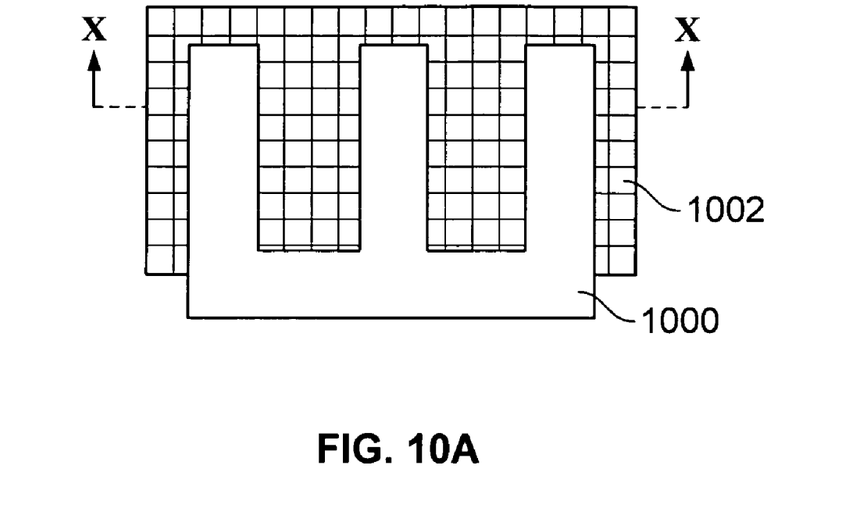
FIG. 10A illustrates a top view of an embodiment where the shape of the plate is different from that illustrated above.

FIG. 10A illustrates a top view of an embodiment where the shape of the plate is different from that illustrated above. In this example, one plane of plate 1000 is not in the shape of a quadrangle. Rather, plate 1000 is in the shape of an "E" where three fingers extend from a common base. Plate 1000 is connected to die 1002. In order to illustrate the shape of plate 1000, there is no molding shown in this figure. In this example, the shape of plate 1000 is used to reduce thermal stress. As materials of the semiconductor package thermally expand at different rates with temperature, a device with a plate in the shape of plate 1000 is less stressed than a device with a plate in the shape of a rectangle. In this example, plate 1000 is shaped such that there are two planes which are parallel to each other. Only one plane is illustrated in this figure.

Figure 10B:
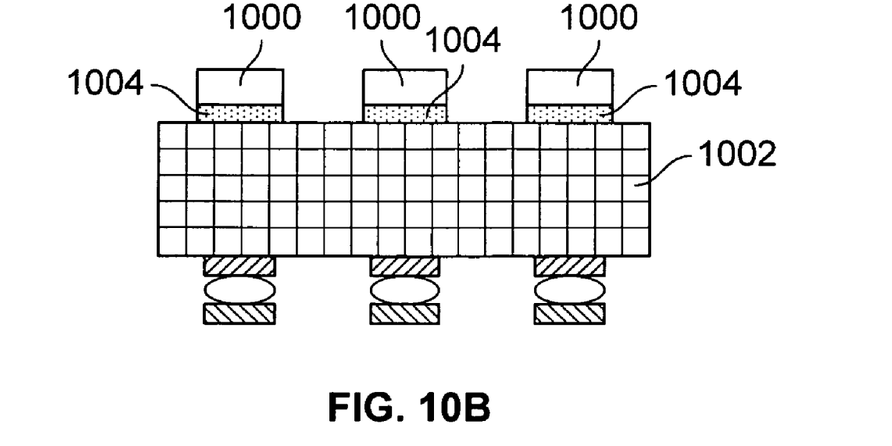
FIG. 10B illustrates a cross sectional view from view X of an embodiment where the shape of the plate is different from that illustrated above.

FIG. 10B illustrates a cross sectional view from view X of an embodiment where the shape of the plate is different from that illustrated above. In this example, plate 1000 is connected to die 1002 by adhesive 1014. In order to illustrate the shape of plate 1000 and be consistent with the previous figure, there is no molding shown in this figure. In this example, plate 1000 is shaped such that there are two planes which are parallel to each other. Only one plane is illustrated in this figure.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of making a semiconductor package including:
    plating a removable substrate with a plating material which includes a first deposit and a second deposit;
    forming a conducting connecting material on a processed surface of a die, wherein the die has the processed surface and an unprocessed surface;
    connecting the conducting connecting material to the first deposit of the plating material;
    attaching a connector to the unprocessed surface of the die, wherein:
        the connector has a first planar portion, a second planar portion, and a third planar portion;
        the third planar portion of the connector is connected substantially perpendicularly to the second planar portion of the connector and is parallel to the first planar portion of the connector; and
        the third planar portion of the connector is connected to the second deposit of the plating material such that the second deposit of the plating material is in the same plane as the first deposit of the plating material and the third planar portion of the connector is parallel to but not in the same plane as the first deposit of the plating material;
    forming insulating material around the plating material, conducting connecting material, die, and connector, including around the first planar portion, the second planar portion, and the third planar portion; and
    removing the removable substrate.

2. The method of claim 1 wherein the connector includes a tape type interconnect.

3. The method of claim 1 wherein attaching the connector includes using an adhesive.

4. The method of claim 3 wherein the adhesive includes epoxy.

5. The method of claim 3 wherein the adhesive includes solder.

6. The method of claim 1 wherein multiple devices are formed simultaneously on the removable substrate.

7. The method of claim 1 further including cutting to separate multiple devices formed simultaneously on the removable substrate.

8. The method of claim 1 wherein the die has a plurality of exposed metal connections that are of a thickness that is commensurate with a thickness of other layers formed during processing of the processed surface.

9. The method of claim 1 wherein the plating material is gold.

10. The method of claim 1 wherein the plating material is a noble metal.

11. The method of claim 1 wherein the conducting connecting material is a gold ball.

12. The method of claim 1 wherein the unprocessed surface of the die is located at or near a drain.

13. The method of claim 1, wherein the connector is part of an electrical connection from a surface of the die other than the processed surface to the exterior of the insulating material, and the electrical connection extends to a same surface as the plating material.

14. The method of claim 1 further including connecting the plating material to a printed circuit board.

15. The method of claim 1 further including connecting the connector to a printed circuit board.

16. The method of claim 15 wherein connecting the connector to a printed circuit board includes using a raised lead.

17. The method of claim 15 wherein connecting the connector to a printed circuit board includes using an adhesive.

18. The method of claim 1 wherein the insulating material has sides and forming insulating material includes forming the insulating material such that the plating material extends to the exterior of the insulating material so that the plating material is exposed on a plurality of the sides of the insulating material.

* * * * *